US006972581B2

(12) United States Patent
Yamashita et al.

(10) Patent No.: US 6,972,581 B2
(45) Date of Patent: Dec. 6, 2005

(54) APPARATUS FOR HANDLING ELECTRONIC COMPONENTS AND METHOD FOR CONTROLLING TEMPERATURE OF ELECTRONIC COMPONENTS

(75) Inventors: Tsuyoshi Yamashita, Tokyo (JP); Noriyuki Igarashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/737,755

(22) Filed: Dec. 18, 2003

(65) Prior Publication Data

US 2004/0124846 A1 Jul. 1, 2004

Related U.S. Application Data

(63) Continuation of application No. PCT/JP02/06851, filed on Jul. 5, 2002.

(30) Foreign Application Priority Data

Jul. 12, 2001 (JP) .............................. 2001-212498

(51) Int. Cl.[7] .......................................... G01R 31/02
(52) U.S. Cl. .................................. 324/760; 324/158.1
(58) Field of Search .............................. 324/760, 765, 324/158.1, 72.5, 754; 165/80.1, 80.2, 80.3, 165/80.4; 219/209; 438/14, 17, 18, 15; 702/130, 702/132

(56) References Cited

U.S. PATENT DOCUMENTS

| 5,528,161 | A | * | 6/1996 | Liken et al. ................. 324/760 |
| 6,445,203 | B1 | * | 9/2002 | Yamashita et al. ........... 324/760 |
| 6,522,127 | B1 | * | 2/2003 | De Fleury et al. ...... 324/207.16 |
| 6,838,897 | B2 | * | 1/2005 | Kim et al. .................... 324/760 |

FOREIGN PATENT DOCUMENTS

| JP | A-2000-171520 | 6/2000 |
| JP | A-2001-004693 | 1/2001 |

* cited by examiner

*Primary Examiner*—Vinh Nguyen
*Assistant Examiner*—Jimmy Nguyen
(74) *Attorney, Agent, or Firm*—Posz Law Group, PLC

(57) ABSTRACT

A handler 1 is provided with an inner chamber 104 containing inside thereof heat sinks 40 of pushers 30, a temperature adjusting unit 91 for controlling the atmosphere temperature inside the inner chamber 104, a test chamber 102 containing inside thereof sockets 40 located on the test head 5 and the inner chamber 104, and a temperature adjusting unit 90 for controlling the atmosphere temperature inside the test chamber 102. With such a handler 1, the temperature control can be conducted so that the temperature of electronic components is brought close to the set temperature of the target test.

14 Claims, 14 Drawing Sheets

APPARATUS FOR HANDLING ELECTRONIC COMPONENTS AND METHOD FOR CONTROLLING TEMPERATURE OF ELECTRONIC COMPONENTS

This application is a Continuation of PCT/JP02/06851 filed Jul. 5, 2002.

TECHNICAL FIELD

The present invention relates to an apparatus for handling electronic components that is capable of handling electronic components which are to be tested, for testing the electronic components such as IC devices, and more particularly to an apparatus for handling electronic components that is capable of controlling the temperature of electronic components which are to be tested and to a method for controlling the temperature of electronic components which are to be tested.

BACKGROUND ART

Test apparatuses for testing electronic components that have been finally fabricated are necessary in the fabrication of electronic components such as IC devices or the like. Apparatuses for testing a plurality of IC devices at one time under temperature conditions (thermal stress conditions) higher than normal temperature are known as a kind of such test apparatuses.

In such test apparatuses, the test is conducted by forming a test chamber above a test head, transporting a test tray holding a plurality of IC devices preheated to the prescribed set temperature to sockets on the test head, while controlling the temperature inside the test chamber to the prescribed set temperature with air, and pushing and connecting the IC devices to the sockets with the pushers. Such a test conducted under thermal stress conditions is used for testing IC devices and classifying them at least into good and defective products.

However, because heat escapes from the external walls and sockets in the test chamber, the temperature of the pushers located in a stand-by mode close to the center of the test chamber becomes higher than the set temperature, and the temperature of the sockets becomes lower than the set temperature. If the IC devices preheated to the prescribed set temperature are pushed into the sockets with the pushers, the temperature of the IC devices initially rises under the effect of the pushers whose temperature has become higher than the set temperature, but then decreases under the effect of sockets whose temperature has become lower than the set temperature. Furthermore, when the IC devices are tested which generated heat by themselves during operation (during testing), the temperature of IC devices sometimes excessively rises above the set temperature during testing.

If the temperature of IC devices thus shifts significantly from the set temperature, accurate testing of the IC devices cannot be conducted. For example, when testing of IC devices is conducted at a temperature excessively lower than the set temperature, defective products are considered to be good products, and when testing of IC devices is conducted at a temperature excessively higher than the set temperature, good products are considered to be defective products and yield is reduced.

A method has been suggested by which the pushers are provided with heat sinks to cool the IC devices whose temperature became higher than the set temperature and those heat sinks are cooled with an air blow or the like. However, because the test chamber (sockets) has to be maintained at the prescribed temperature, a limitation is placed on the decrease in air temperature.

DISCLOSURE OF THE INVENTION

With the foregoing in view, it is an object of the present invention to provide an apparatus for handling electronic components that is capable of controlling the temperature of electronic devices so as to bring it close to the set temperature of the target test and to a method for controlling the temperature of electronic devices to be tested.

To attain the above-described object, the first apparatus for handling electronic components in accordance with the present invention is an apparatus for handling electronic components in which terminals of the electronic components to be tested can be pushed into contact portions of a test head with the pushers provided with heat absorbing and radiating bodies in order to conduct testing of the electronic components, comprising a unit for controlling the temperature of the atmosphere where the contact portions of the test head are located and a unit for controlling the temperature of the atmosphere where the heat absorbing and radiating bodies of the pushers are located (1).

Further, the second apparatus for handling electronic components in accordance with the present invention is an apparatus for handling electronic components, in which terminals of the electronic components to be tested can be pushed into contact portions of a test head with the pushers provided with heat absorbing and radiating bodies in order to conduct testing of the electronic components, comprising a first chamber containing inside thereof the heat absorbing and radiating bodies of said pushers, a unit for controlling the atmosphere temperature inside the first chamber, a second chamber containing inside thereof the contact portions of the test head and the first chamber, and a unit for controlling the atmosphere temperature inside the second chamber (2).

Further, the method for controlling the temperature of electronic components in accordance with the present invention is a method for controlling the temperature of electronic components to be tested in the apparatus for handling electronic components, in which terminals of the electronic components to be tested can be pushed into contact portions of a test head with the pushers provided with heat absorbing and radiating bodies in order to conduct testing of the electronic components, wherein the temperature of the atmosphere where the contact portion of said test head are located and the temperature of the atmosphere where the heat absorbing and radiating bodies of said pushers are located are controlled separately (11).

The problem associated with the conventional technology was that the temperature of the pushers located in a stand-by mode close to the center of the chamber was getting higher than the set temperature, and the temperature of the contact portions of the test head from which heat could easily escape was getting lower than the set temperature. However, in accordance with the above-described inventions (1, 2, 11), the temperature control of the contact portions of the test head and the heat absorbing and radiating bodies of the pushers can be conducted independently. Therefore the above-described problem can be resolved.

Furthermore, when the temperature of the electronic components to be tested rises due to heat generation by the components themselves, the heat of the electronic components to be tested is transmitted from the pushers to the heat absorbing and radiating bodies and then radiated from the heat absorbing and radiating bodies. In accordance with the above-described inventions (1, 2, 11), because the heat absorbing and radiating bodies can be temperature controlled, cooling the heat absorbing and radiating bodies to the prescribed temperature makes it possible to prevent excess increase in temperature of the electronic components to be tested. At this time, because the contact portions of the head test can be temperature controlled separately, cooling thereof following cooling of the heat absorbing and radiating bodies can be prevented and excess temperature decrease in the contact portions and, therefore, in the electronic components to be tested can be prevented.

Conducting independent temperature control of the contact portions of the test head and the heat absorbing and radiating bodies of the pushers makes it possible to conduct tests accurately, while controlling the temperature of the electronic components to be tested so as to bring it close to the set temperature.

In the apparatus according to the above-described invention (2), a plurality of pushers and a plurality of contact portions of the test head may be provided to enable testing of a plurality of electronic components to be tested at one time, the heat absorbing and radiating bodies of the pushers may be provided for each pusher, the temperature of atmosphere inside the first chamber may be controlled with a temperature-adjusting medium, and the temperature-adjusting medium inside the first chamber may be supplied in parallel to the heat absorbing and radiating bodies of the pushers (3).

In the apparatus according to the above-described invention (3), the pushers may push terminals of electronic components to be tested into contact portions of a test head by being pressed with a pressing member supported with a support member, a plurality of through holes may be formed in the support member, and the temperature-adjusting medium inside the first chamber may be supplied in parallel to the heat absorbing and radiating bodies of the pushers by passing through the through holes formed in the support member (4).

When the temperature-adjusting medium is successively supplied in series to the heat absorbing and radiating bodies of the pushers, the temperature of the temperature-adjusting medium rises due to heat radiation from the heat absorbing and radiating bodies each time the temperature-adjusting medium passes through the heat absorbing and radiating bodies. Therefore, the heat absorbing and radiating bodies through which the temperature-adjusting medium passes at the end are sometimes difficult to cool. Such temperature gradient in the temperature-adjusting medium occurs especially easily when a large number of electronic components are tested at the same time. However, with the above-described inventions (3, 4), the temperature-adjusting medium is supplied in parallel to the heat absorbing and radiating bodies. Therefore, the temperature-adjusting medium is supplied identically to each heat absorbing and radiating body and insufficient cooling of the heat absorbing and radiating bodies caused by the temperature gradient in the temperature-adjusting medium is prevented.

In the apparatus according to the above-described invention (2), a plurality of pushers and a plurality of contact portions of the test head may be provided to enable testing of a plurality of electronic components to be tested at one time, the heat absorbing and radiating bodies of the pushers may be provided for each pusher, the temperature of atmosphere inside the first chamber may be controlled with a temperature-adjusting medium, and the temperature-adjusting medium inside the first chamber may be supplied in series to the heat absorbing and radiating bodies of the pushers (5).

According to the above-described invention (5), if the problem of temperature gradient in the temperature-adjusting medium is not that important, for example, when the number of electronic components to be tested at one time is small, the temperature of the heat absorbing and radiating bodies can be controlled with the temperature-adjusting medium by employing a simple structure.

In the apparatus according to the above-described inventions (3–5), the temperature of atmosphere inside the second chamber may be controlled with a temperature-adjusting medium and the temperature-adjusting medium inside the second chamber may be supplied in parallel to the contact portions of the test head (6).

In the apparatus according to the above-described invention (6), a plurality of the first chambers may be provided independently and the temperature-adjusting medium inside the second chamber may be supplied in parallel to the contact portions of the test head by passing between those first chambers (7).

When the temperature-adjusting medium is supplied successively in series to the contact portions of the test head, the temperature-adjusting medium is affected by the temperature of the contact portions each time the temperature-adjusting medium passes through the contact portions and the temperature of the contact portions through which the temperature-adjusting medium passes at the end is sometimes difficult to control. Such temperature gradient in the temperature-adjusting medium occurs especially easily when a large number of electronic components are tested at the same time. However, with the above-described inventions (6, 7), the temperature-adjusting medium is supplied in parallel to all contact portions. Therefore, the temperature-adjusting medium is supplied identically to each contact portion and difficulties associated with temperature control of the contact bodies caused by the temperature gradient in the temperature-adjusting medium are prevented.

In the apparatus according to the above-described inventions (5–7), the space where the heat absorbing and radiating bodies of the pushers are positioned in the first chamber may be partitioned into an upper-layer portion and a lower-layer portion and the temperature-adjusting medium may be supplied so as to flow in the mutually opposite directions in the upper-layer portion and lower-layer portion (8).

According to the above-described invention (8), the temperature-adjusting medium is supplied to the upper portion (portion positioned in the upper layer portion) and lower portion (portion positioned in the lower-layer portion) of the heat absorbing and radiating bodies of the pushers from the different directions. As a result, even though the temperature of the temperature-adjusting medium changes as it passes through a plurality of heat absorbing and radiating bodies, the heat absorbing and radiating bodies, as a total of the upper portion and lower portion, can be controlled to an almost constant temperature.

In the apparatus according to the above-described inventions (5–7), the heat absorbing and radiating bodies of the plurality of pushers in the first chamber may be divided in no less than two groups and each space where the each group is located may comprise a lower-level portion where the heat absorbing and radiating bodies of the pushers are positioned and into which the temperature-adjusting medium is supplied, an upper-layer portion into which the temperature-adjusting medium that has passed through the heat absorbing and radiating bodies is released, and a connection portion for connecting the lower-level portion and the upper-layer portion (9).

According to the above-described invention (9), the temperature-adjusting medium is supplied to each group of heat absorbing and radiating bodies that have been divided into no less than two groups. Therefore, the number of heat absorbing and radiating bodies through which the temperature-adjusting medium passes is reduced and the increase in temperature of temperature-adjusting medium can be suppressed. Thus, with the above-described invention (9), insufficient cooling of heat absorbing and radiating bodies caused by the increase in temperature of temperature-adjusting medium can be suppressed.

In the apparatus according to the above-described inventions (5–9), the heat absorption and radiation capacity of the heat absorbing and radiating bodies of the plurality of pushers may gradually increase along the flow direction of the temperature-adjusting medium (10).

According to the above-described invention (10), the pushers relating to the heat absorbing and radiating bodies to which the temperature-adjusting medium is supplied at the beginning can be cooled despite a low heat absorption and radiation capacity of the heat absorbing and radiating bodies, because the temperature of the temperature-adjusting medium is low. The pushers relating to the heat absorbing and radiating bodies to which the temperature-adjusting medium is supplied at the end can be cooled despite the increase in the temperature of the temperature-adjusting medium, because the heat absorption and radiation capacity of the heat absorbing and radiating bodies is high. With the invention (10), each pusher can be thus controlled to an almost constant temperature.

BEST MODE FOR CARRYING OUT THE INVENTION

[First Embodiment]

The first embodiment of the present invention will be described below with reference to the appended drawings.

Figure 1:
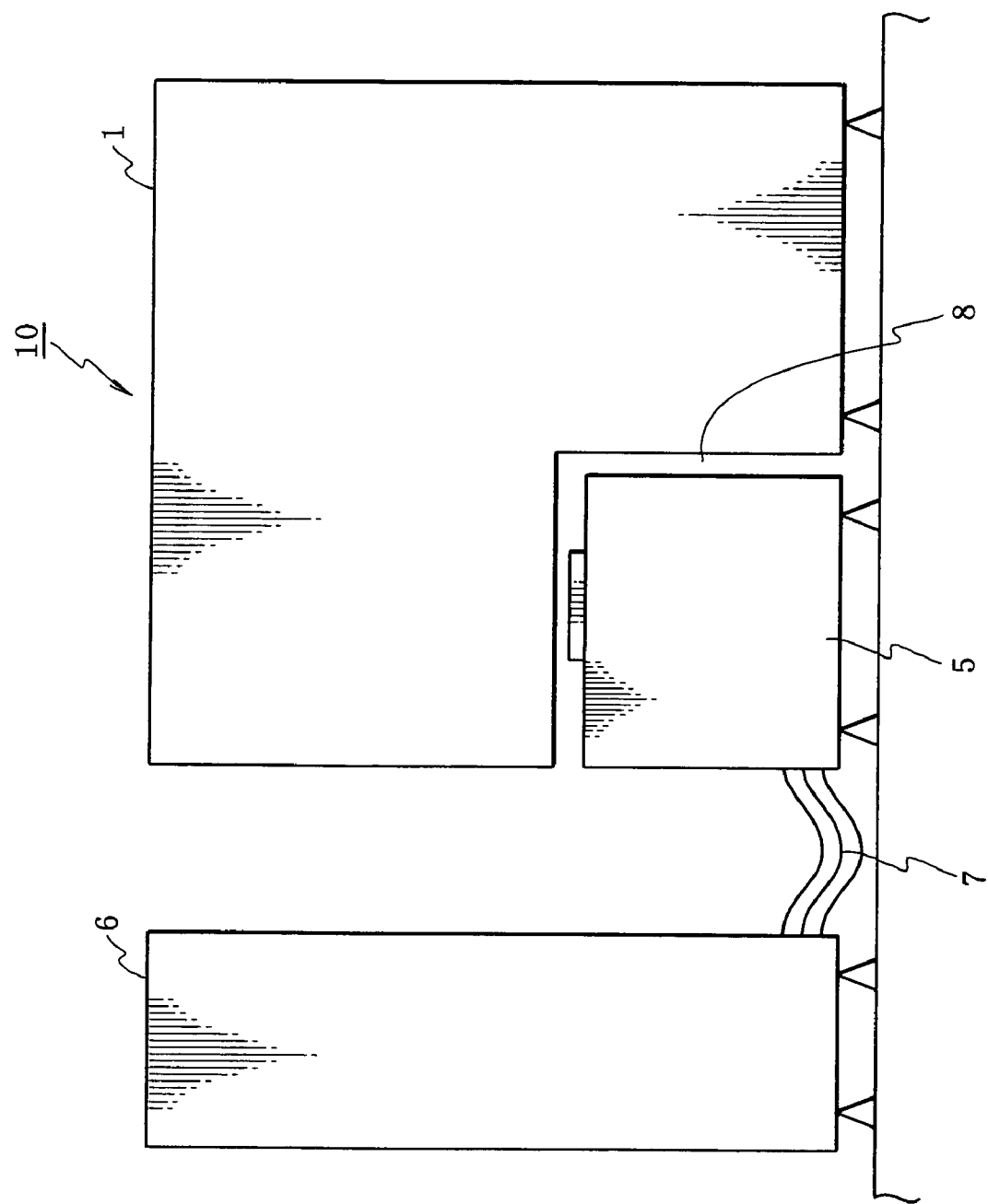
FIG. 1 is a side view of the entire IC device test apparatus comprising the handler of the first embodiment of the present invention.

First, the entire structure of an IC device test apparatus equipped with a handler of the present embodiment will be explained. As shown in FIG. 1, an IC device test apparatus 10 comprises a handler 1, a test head 5, and a main testing unit 6. The handler 1 executes an action of successively transporting IC devices (an example of electronic components) which are to be tested into sockets provided on the test head 5, classifying the tested IC devices according to the test results and storing them in the prescribed tray.

The sockets (equivalent to contact portions in accordance with the present invention) provided on the test head 5 are electrically connected via a cable 7 to the main testing unit 6, and are used for connecting the IC devices removably installed in the sockets to the main testing unit 6 via the cable 7 and for testing the IC devices by test electric signals from the main testing unit 6.

The lower part of handler 1 mainly contains a control unit for controlling the handler 1, and an space 8 is provided in part thereof. The test head 5 is replaceably disposed in the space 8 and the IC devices can be installed in the sockets on the test head 5 via a through hole formed in the handler 1.

Figure 2:
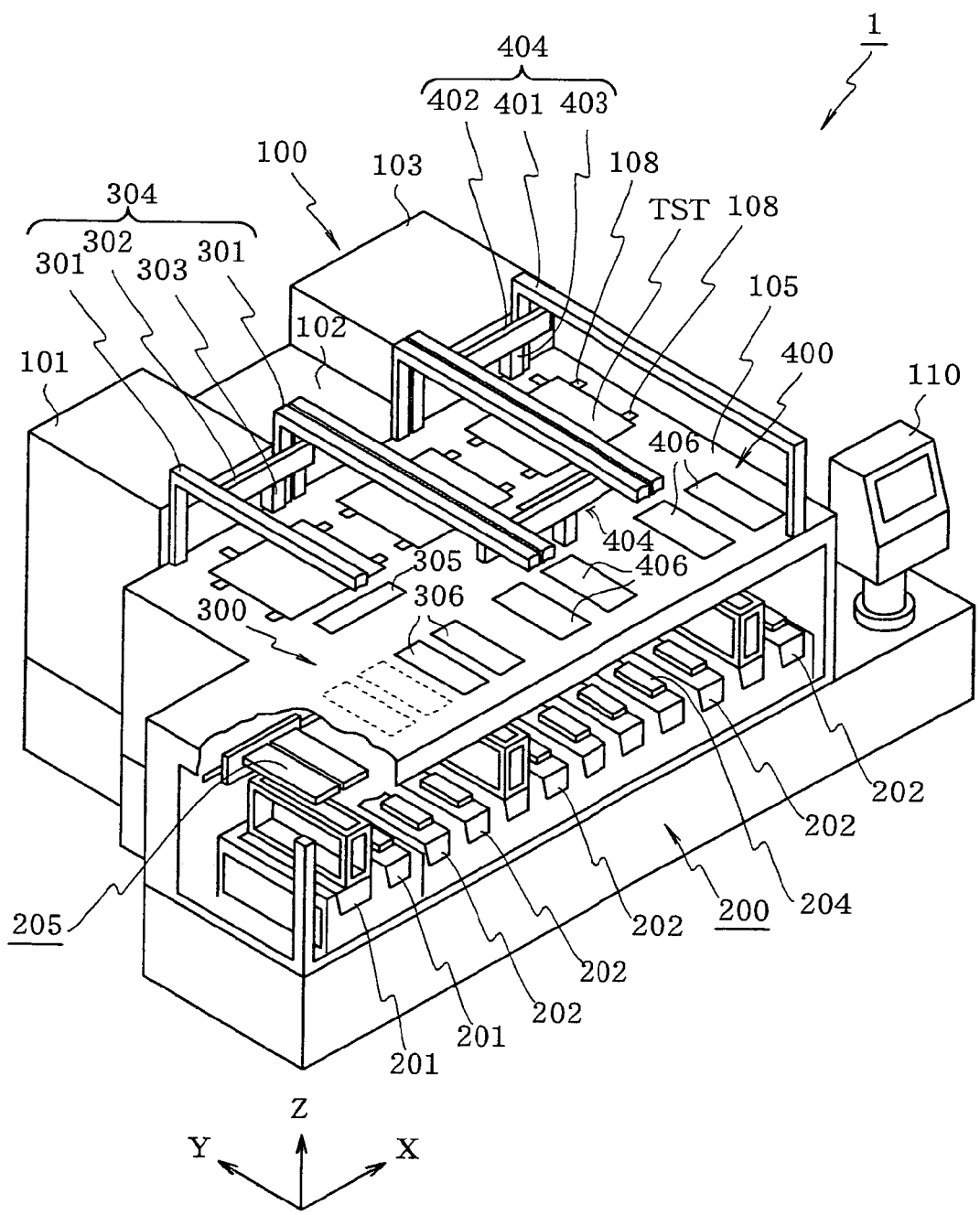
FIG. 2 is a perspective view of the handler shown in FIG. 1.
Figure 3:
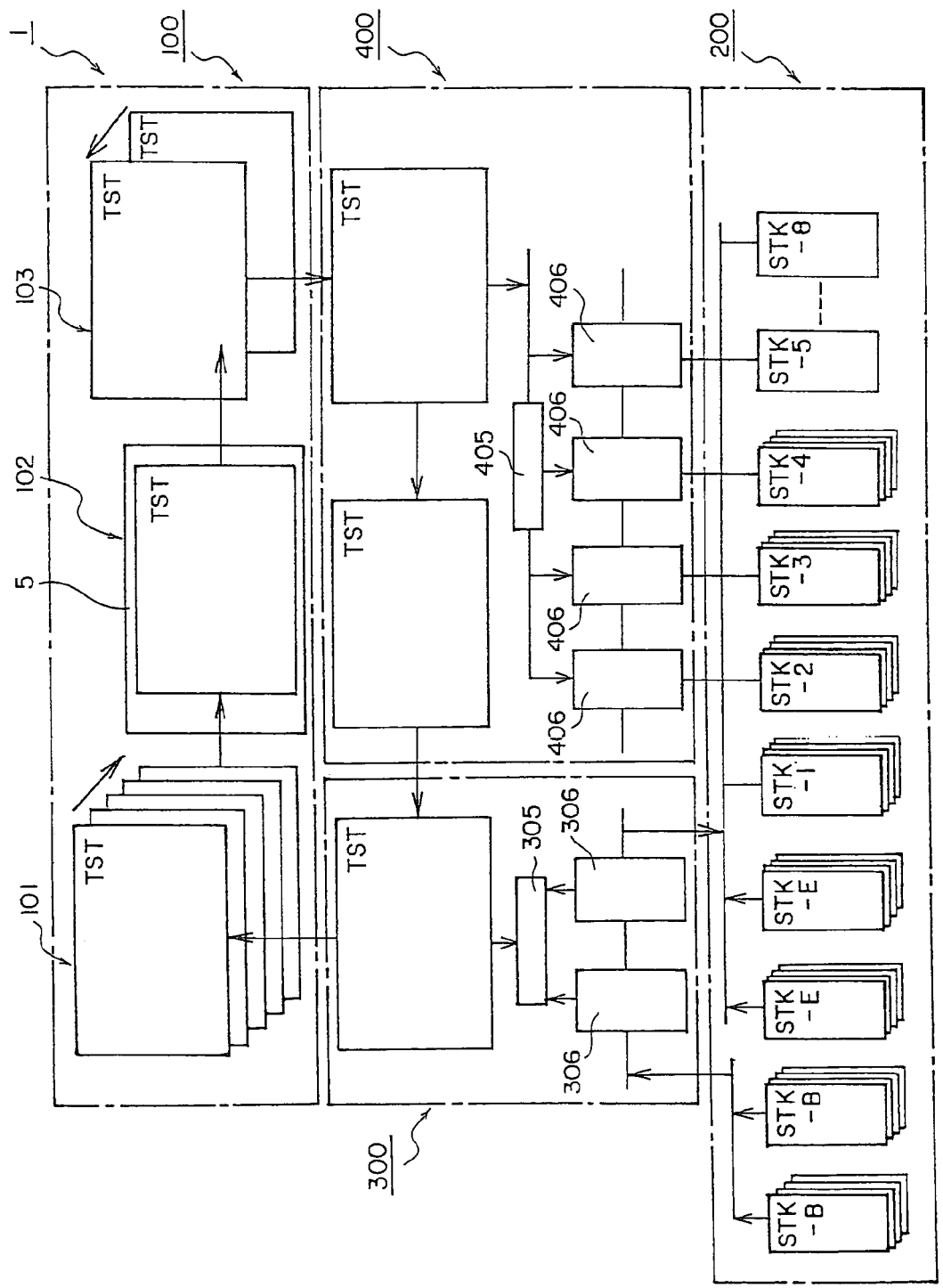
FIG. 3 is a flow chart illustrating a method for handling the IC devices to be tested.
Figure 6:
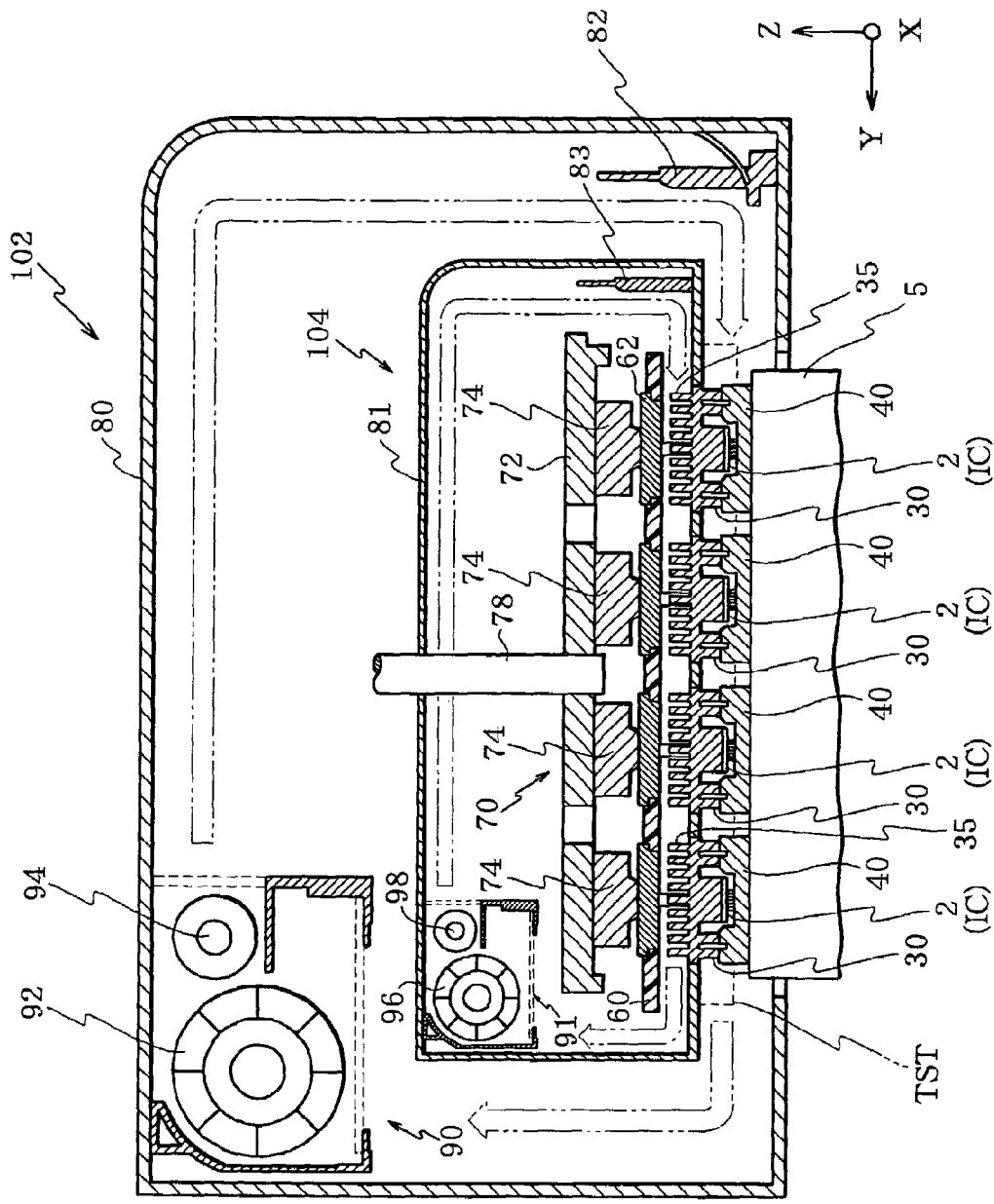
FIG. 6 is a cross-sectional view of the main part inside a test chamber of the handler.

The handler 1 is an apparatus for testing the IC devices serving as electronic components which are to be tested in a state with a temperature higher (high temperature) and a state with a temperature lower (low temperature) than the normal temperature. As shown in FIG. 2 and FIG. 3, the handler 1 comprises a chamber section 100 composed of a thermostatic chamber 101, a test chamber 102, and a heat-removing chamber 103. The upper part of test head 5 shown in FIG. 1 is inserted into the test chamber 102, as shown in FIG. 6, to conduct testing of IC devices 2 therein.

FIG. 3 is provided for explaining a method for handling the IC devices for testing in the handler of the present embodiment and some of the members that are actually arranged in the vertical direction are shown in a plan view. Therefore, the mechanical (three-dimensional) structure can be better understood by referring to FIG. 2.

As shown in FIG. 2 and FIG. 3, the handler 1 of the present embodiment is composed of an IC storing section 200 for storing the IC devices which are to be further tested or for classifying and storing the tested IC devices, a loader section 300 for transporting the IC devices which are transported from the IC storing section 200 for testing into a chamber section 100, the chamber section 100 containing a test head, and an unloader section 400 for removing the IC devices that have been tested in the chamber section 100 and classifying them. Inside the handler 1, the IC devices are transported being housed in test trays.

Figure 5:
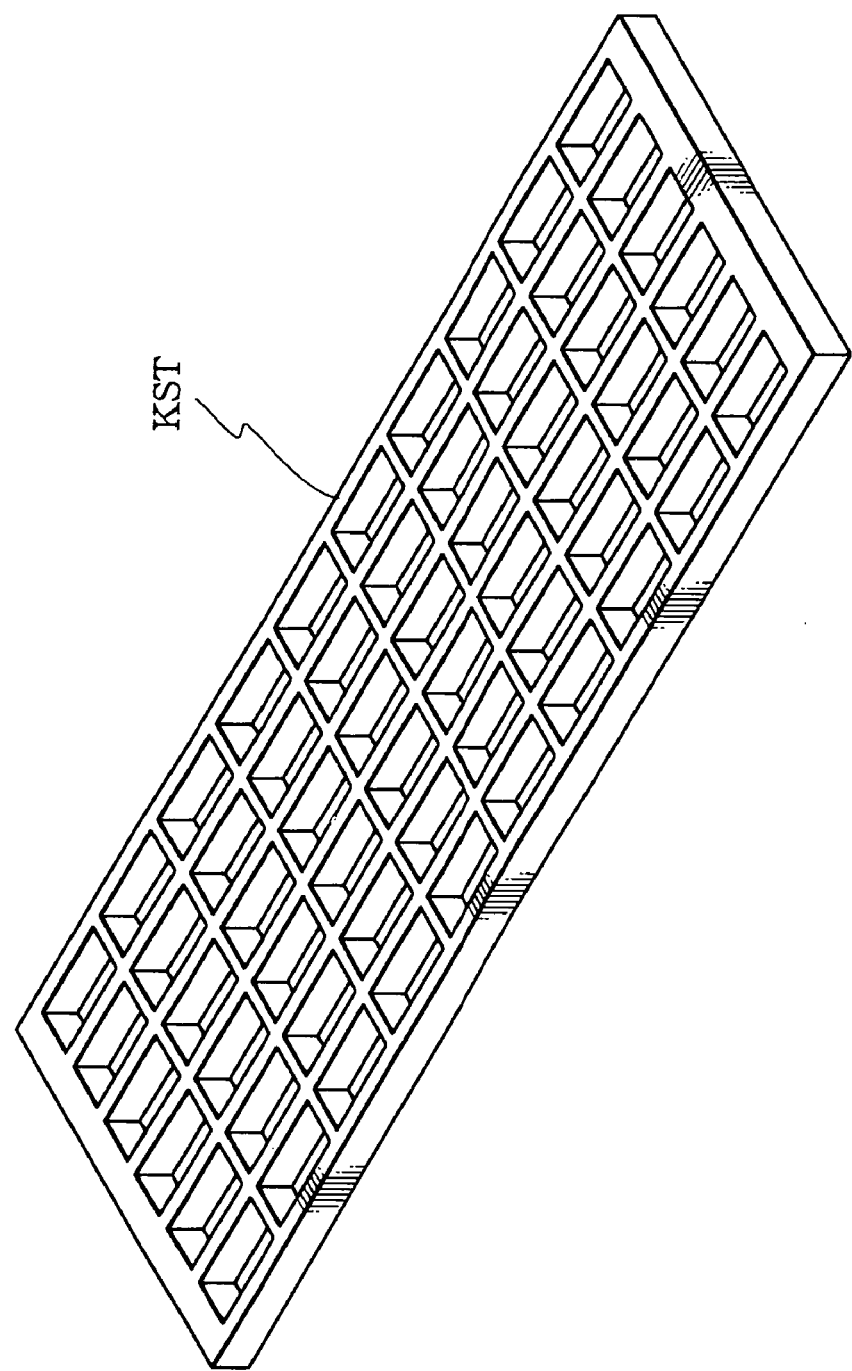
FIG. 5 is a perspective view of a customer tray used in the handler.

Multiple IC devices prior to setting into the handler 1 are housed in a customer tray KST shown in FIG. 5. In this state, they are supplied to the IC storing section 200 of handler 1 shown in FIG. 2 and FIG. 3 and then IC devices 2 are carried from the customer tray KST over to the test tray TST (see FIG. 7) for transportation inside the handler 1. Inside the handler 1, as shown in FIG. 3, the IC devices are moved in a state in which they are carried on the test trays TST, subjected to high-temperature and low-temperature thermal stresses, tested (inspected) for appropriate operation, and classified according to the test results. Individual parts located inside the handler 1 will be described below in detail.

Firstly, parts relating to the IC storing section 200 will be described.

As shown in FIG. 2, a pre-test IC stocker 201 for storing IC devices prior to the test and an after-test IC stocker 202 for storing the IC devices classified according to the test results are provided in the IC storing section 200.

Figure 4:
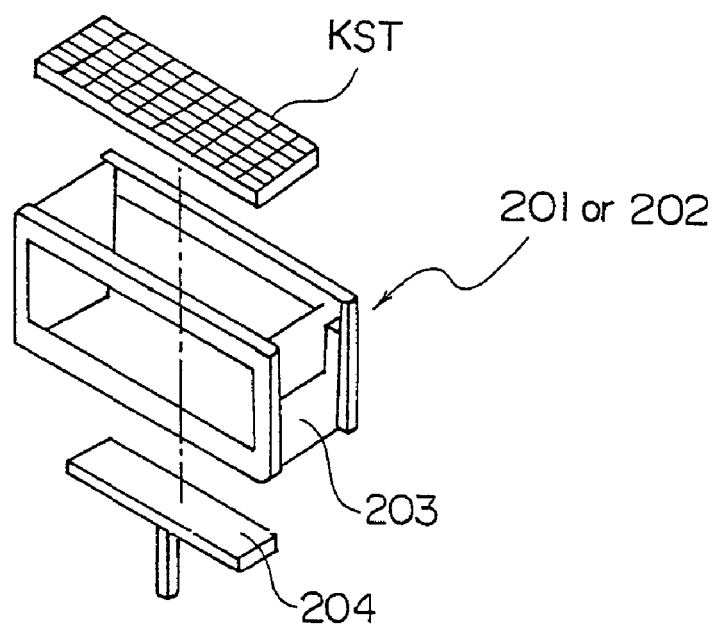
FIG. 4 is perspective view illustrating the structure of an IC stocker of the handler.

Those pre-test IC stocker 201 and after-test IC stocker 202 comprise, as shown in FIG. 4, a frame-like tray support frame 203 and an elevator 204 which is inserted from the lower part of the tray support frame 203 and can be lifted and lowered. A plurality of customer trays KST are stacked and supported on the tray support frame 203 and only the stacked customer trays KST are moved up and down by the elevator 204. As shown in FIG. 5, the customer tray KST in the present embodiment comprises IC device containers of 10 rows×6 columns.

The customer trays KST containing the IC devices to be tested are stacked and held in the pre-test IC stocker 201 shown in FIG. 2. Furthermore, the customer trays KST containing the IC devices that have been tested and classified are stacked and held in the after-test IC stocker 202.

Because the pre-test IC stocker 201 and after-test IC stocker 202 have almost identical structures, parts of the pre-test IC stocker 201 can be used in the after-test IC stocker 202 and vice versa. Therefore, the number of pre-test IC stockers 201 and the number of after-test IC stocker 202 can be easily changed, if necessary.

As shown in FIG. 2 and FIG. 3, in the present embodiment, two stockers STK-B are provided as the pre-test IC stockers 201. Two empty stockers STK-E which are to be supplied to an unloader section 400 are provided as the after-test IC stockers 202 nearby the stocker STK-B. Further, eight stockers STK-1, STK-2, . . . , STK-8 are provided as the after-test IC stockers 202 close thereto, such a structure allowing for classification and storing of up to eight groups according to the test results. In other words, classification can be conducted not only into good and defective products, but among the good products, into those with a high, medium, and low operation speed, and among the defective products, into those that require re-testing.

Secondly, parts relating to the loader section 300 will be described.

Customer trays KST housed in the tray support frame 203 of pre-test IC stockers 201 shown in FIG. 4 are moved from below the apparatus substrate 105 into windows 306 of loader section 300 with a tray transfer arm 205 provided between the IC storing section 200 and apparatus substrate 105, as shown in FIG. 2. Then, in the loader section 300, the IC devices to be tested that have been stacked in the customer trays KST are transferred with a X-Y transportation unit 304 into a preciser 305 where the mutual arrangement of the IC devices to be tested is corrected. The IC devices that have been transferred into the preciser 305 are then retransferred into a test tray TST that has stopped on the loader section 300 by using again the X-Y transportation unit 304.

The X-Y transportation unit 304 for retransferring the IC devices to be tested from customer trays KST to test tray TST, as shown in FIG. 2, comprises two rails 301 installed above the apparatus substrate 105, a movable arm 302 capable of moving reciprocally (the movement direction is set to Y direction) between the test tray TST and customer tray KST by means of two rails 301, and a movable head 303 which is supported by the movable arm 302 and can move in the X direction along the movable arm 302.

A suction head is attached downwardly to the movable head 303 of the X-Y transportation unit 304. When the suction head moves, while sucking in the air, the IC devices to be tested are sucked up and those IC devices to be tested are retransferred to the test tray TST. For example, eight such suction heads can be attached to the movable head 303 and eight IC devices to be tested can be retransferred to the test tray TST at the same time.

Thirdly, parts relating to the chamber section 100 will be described.

The above-described test tray TST is fed to the chamber section 100 after the IC devices to be tested have been transferred with the loader section 300, and the devices IC are tested in a state in which they are carried on the test tray TST.

As shown in FIG. 2 and FIG. 3, the chamber section 100 is composed of a thermostatic chamber 101 for providing the target high-temperature or low-temperature thermal stresses to the IC devices transferred into the test tray TST, a test chamber 102 in which the IC devices provided with thermal stresses in the thermostatic chamber 101 are installed in the sockets on the test head, and a heat-removing chamber 103 for relieving the provided thermal stressed from the IC devices tested in the test chamber 102.

In the heat-removing chamber 103, if a high temperature was applied in the thermostatic chamber 101, the tested IC devices are cooled with air blow to return the temperature thereof to room temperature. If a low temperature was applied in the thermostatic chamber 101, the tested IC devices are heated with warm blast or a heater to a temperature at which no dew condensation occurs. The tested IC devices subjected to stress relieving are moved out to the unloader section 400.

As shown in FIG. 2, the thermostatic chamber 101 and heat-removing chamber 103 of the chamber section 100 are arranged so as to protrude upwardly from the test chamber 102. Furthermore, the thermostatic chamber 101, as shown schematically in FIG. 3, is provided with a vertical transportation unit, and a plurality of test trays TST are supported on the vertical transportation unit in a stand-by mode till the test chamber 102 is emptied. It is during this stand-by period that high-temperature or low-temperature thermal stresses are applied to the IC devices to be tested.

Figure 7:
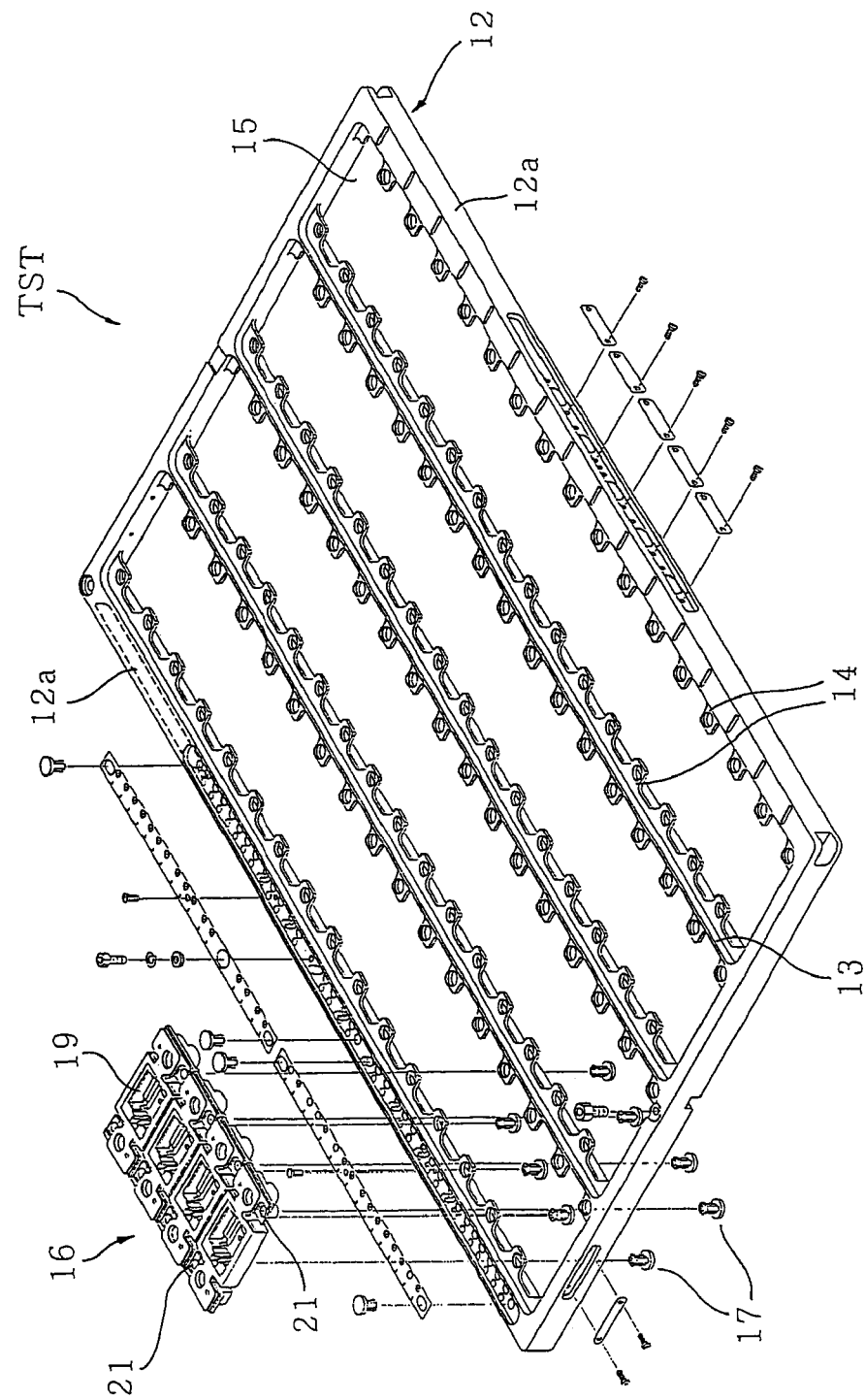
FIG. 7 is a partial exploded perspective view illustrating a test tray used in the handler.

As shown in FIG. 6, a test head 5 is arranged in the central lower part of test chamber 102 and the test trays TST are transferred onto the test head 5. Here, all the IC devices 2 held in the test tray TST shown in FIG. 7 are successively electrically connected to the test head 5 and all the IC devices 2 held in the test tray TST are tested. On the other hand, the test trays TST that have already been subjected to the test are subjected to thermal stress relieving in the heat-removing chamber 103, and after the temperature of IC devices 2 has returned to room temperature, the devices 2 are discharged into the unloader section 400 shown in FIG. 2 and FIG. 3.

Furthermore, as shown in FIG. 2, an inlet opening for feeding the test trays TST from the apparatus substrate 105 and an outlet opening for feeding the test trays TST out to the apparatus substrate 105 are formed above the thermostatic chamber 101 and heat-removing chamber 103. Test tray transportation units 108 for transporting the test trays TST through those openings are installed on the apparatus substrate 105. Those transportation units 108 are composed, for example, of rotary rollers or the like. The test trays TST discharged from the heat-removing chamber 103 are transported to the unloader section 400 with the test tray transportation units 108 provided on the apparatus substrate 105.

FIG. 7 is an exploded perspective view illustrating the structure of a test tray TST used in the present embodiment. The test tray TST comprises a rectangular frame 12. A plurality of parallel crosspieces 13 are provided equidistantly on the frame 12. A plurality of mounting pieces 14 are formed in a protruding condition with an equal spacing in the longitudinal direction on both sides of those crosspieces 13 and on the sides 12a of the frame 12 which are parallel to the crosspieces 13. Respective housing parts 15 are composed by those pairs of mounting pieces 14 that face each other of the plurality of mounting pieces 14 provided between those crosspieces 13 and between the crosspieces 13 and sides 12a.

The structure allows one insert 16 to be contained in each housing part 15. The insert 16 is mounted in a floating state on the two mounting pieces 14 with fasteners 17. In the present embodiment, a total of 4×16 inserts 16 can be mounted on one test tray TST. Thus, the test tray TST of the present embodiment comprises 4 rows×16 columns IC device receptacles. The IC devices 2 to be tested are loaded into the test tray TST by setting the IC devices 2 into the inserts 16.

Figure 8:
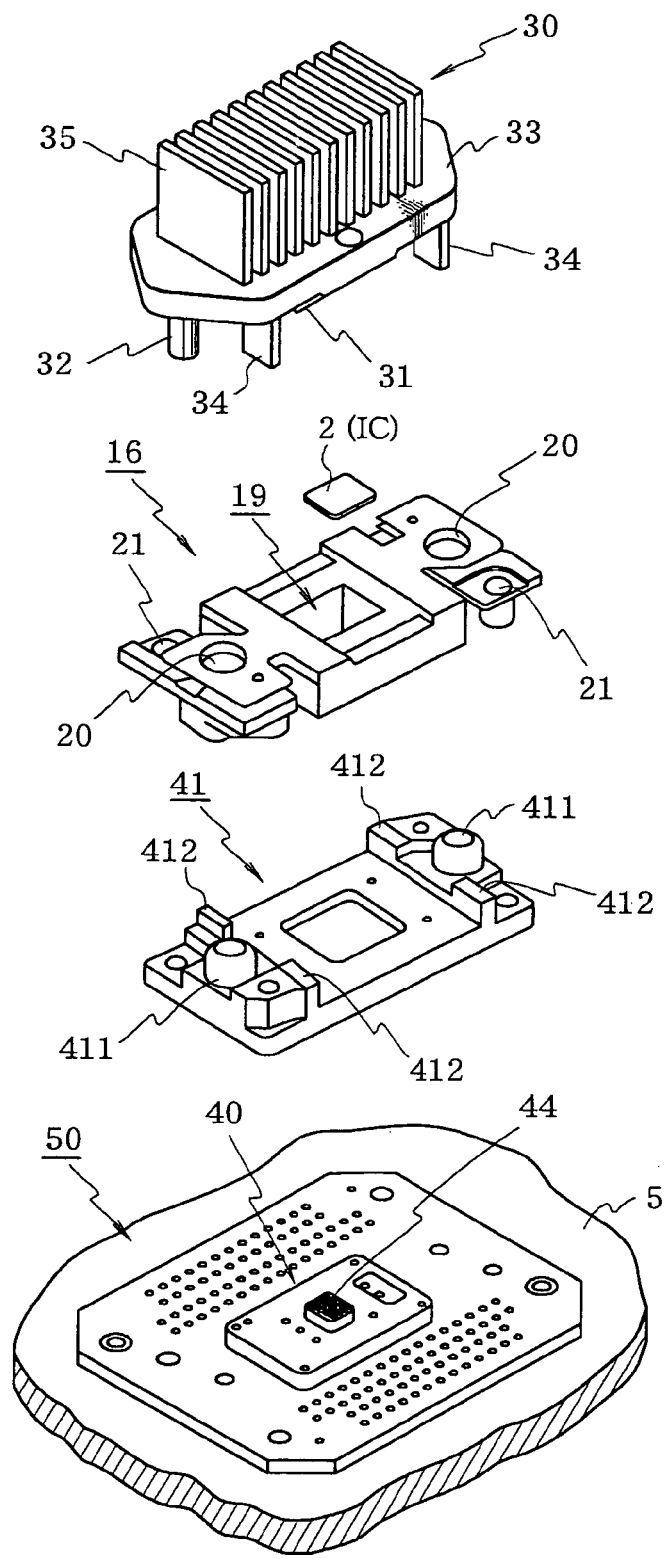
FIG. 8 is an exploded perspective view illustrating a structure in the vicinity of a socket on a test head of the handler.

In the insert 16 of the present embodiment, as shown in FIG. 7 and FIG. 8, an IC housing part 19 in the form of a rectangular recess for housing the IC device 2 to be tested is formed in the central portion. Further, guide holes 20 into which the guide pins 32 of pushers 30 are to be inserted are formed in the central portions on both ends of insert 16, and holes 21 for mounting onto mounting pieces 14 of test tray TST are formed in the corner portions on both ends of insert 16.

As shown in FIG. 8, a socket board 50 is arranged above the test head 5, and a socket 40 comprising probe pins 44 serving as connection terminals is secured above the socket board 50. The number and pitch of probe pins 44 correspond to those of connection terminals of IC devices 2, and an upward force is imparted thereto with a spring (not shown in the figures).

Figure 9:
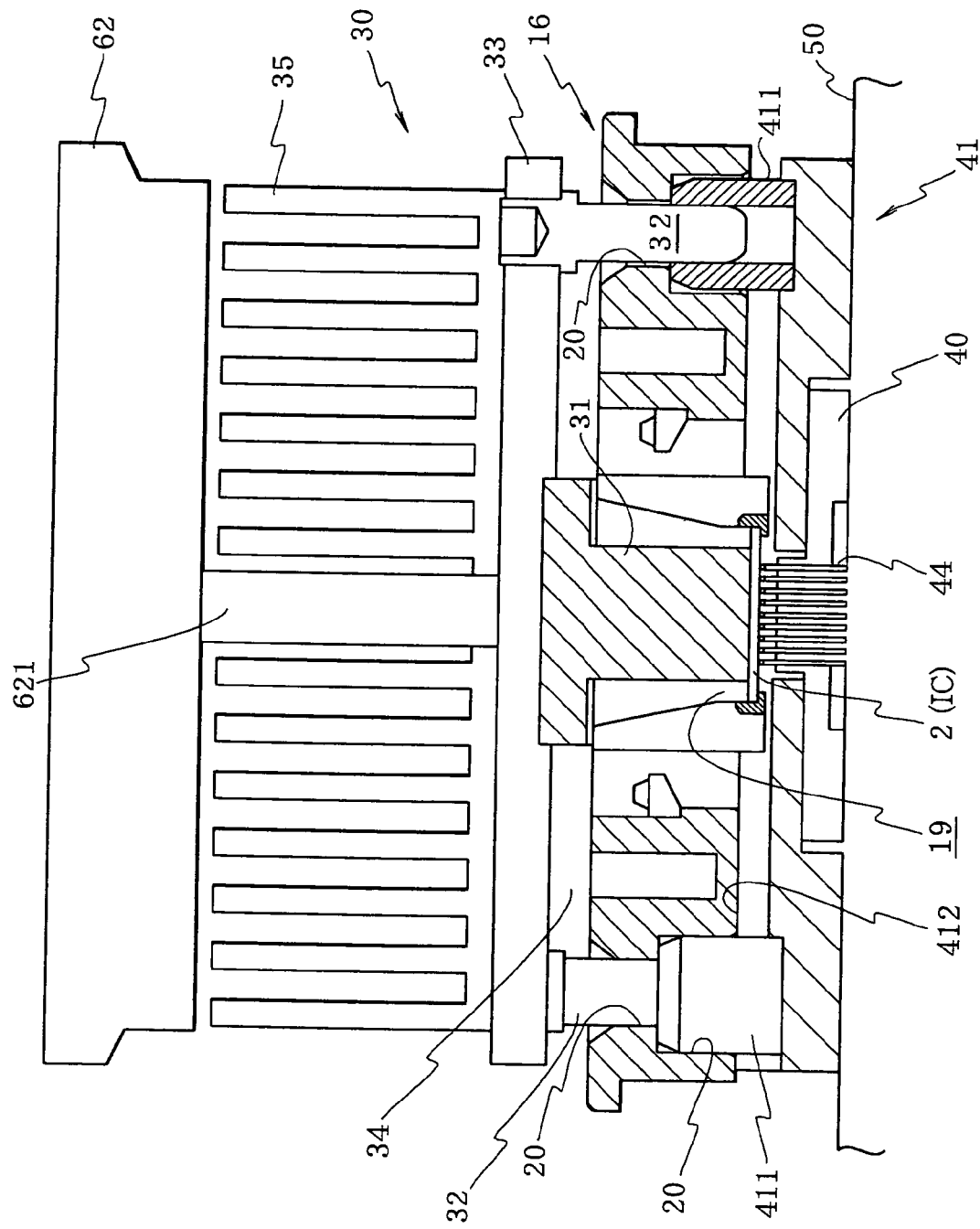
FIG. 9 is a cross-sectional view in the vicinity of a pusher (in a lowered state thereof) in the handler.

Further, as shown in FIG. 8 and FIG. 9, a socket guide 41 is secured above the socket board 50 so that the probe pins 44 provided in socket 40 are exposed. Guide bushings 411 for inserting the two guide pins 32 formed in the pusher 30 and positioning the two guide pins 32 with respect to each other are provided on both sides of socket guide 41.

As shown in FIG. 6 and FIG. 8, pushers 30 are provided on the upper side of test head 5, their number corresponding to that of sockets 40. The pusher 30, as shown in FIG. 8 and FIG. 9, comprises a pusher base 33 secured to a rod 621 of the below-described adapter 62. A pushing member 31 for pushing the IC device 2 to be tested is provided downwardly in the lower center of pusher base 33, and guide pins 32 which are to be inserted into the guide bushings 411 of socket guide 41 and guide holes 20 of insert 16 are provided in both end portions on the lower side of pusher base 33. Furthermore, stopper pins 34 are provided between the pushing member 31 and guide pins 32; when the pusher 30 is moved downward by a Z axis drive unit 70, the stopper pins are capable of controlling to lower limit of this movement by abutting upon a stopper surface 412 of socket guide 41.

On the other hand, a heat sink 35 (equivalent to a heat absorbing and radiating body in accordance with the present invention) is provided on the upper side of pusher base 33. The heat sink 35 is composed of a plurality of heat radiating fins composed of a material with excellent thermal conductivity, for example, aluminum, copper, alloys thereof, carbon-containing material and the like. Similarly, the pusher base 33 and pushing member 31 are also composed of a metal with excellent thermal conductivity, for example, aluminum, copper, iron, alloys thereof (stainless steel including), thereby allowing for heat of IC devices 2 which are being tested to be transmitted from the pushing member 31 that has come into contact with the IC devices 2 to the heat sink 35 via the pusher base 33 and to be dissipated in the environment from the heat sink 35. Further, the heat sink 35 may be also composed of heat pipes rather than heat radiating fins.

As shown in FIG. 9, rods 621 (two rods) are provided downwardly in the adapter 62, and the pusher base 33 of pusher 30 is supported and secured with those rods 621. As shown in FIG. 6, each adapter 62 is elastically held in a match plate 60. The match plate 60 is installed so that the test tray TST can be inserted between the pusher 30 and socket 40 so as to be positioned above the test head 5. The pusher 30 held in the match plate 60 is free to move along the Z axis direction with respect to a drive plate (drive body) 72 of Z axis drive unit 70 or test head 5. Furthermore, the test tray TST is transported between the pusher 30 and socket 40 from the direction (X axis) perpendicular to the sheet surface as shown in FIG. 6. A transportation roller or the like is used as transportation means for the test trays TST inside the chamber section 100. During transportation and movement of test tray TST, the drive plate of Z axis drive unit 70 rises along the Z axis direction and a clearance sufficient for inserting the test tray TST is formed between the pusher 30 and socket 40.

As shown in FIG. 6, pressing members 74 are secured to the lower surface of drive plate 72 and can apply pressure to the upper surface of adapter 62 that is being held in the match plate 60. A drive shaft 78 is secured to the drive plate 72, a drive source (not shown in the figures) such as a motor is connected to the drive shaft 78, and the drive shaft 78 can be moved upward and downward along the Z axis direction, pushing the adapter 62.

The match plate 60 has a structure that can be replaced, together with the adapter 62 and pusher 30, according to the shape of IC devices 2 which are to be tested and the number of sockets on the test head 5 (the number of IC devices 2 that are to be tested at the same time). Thus, providing a replaceable match plate 60 makes it possible to use the Z axis drive unit 70 designed for general applications.

The test chamber 102 is composed of an almost sealed casing 80, as shown in FIG. 6. An inner chamber 104 for temperature controlling the heat sink 35 of pusher 30 is provided inside the casing 80. The inner chamber 104 is also composed of a casing 81 which is almost sealed, as shown in FIG. 6.

The above-mentioned drive shaft 78, drive plate 72, pressing member 74, match plate 60, adapter 62, and heat sink 35 of pusher 30 are contained inside the casing 81 constituting the inner chamber 104. In addition, an air blowing unit for temperature adjustment 91 and a temperature sensor 83 are provided inside the casing. The drive shaft 78 can move up and down in the Z axis direction through a hole provided in the upper wall of casing 81. Furthermore, the pusher 30 (pushing member 31, guide pins 32, stopper pins 34) positioned below the heat sink 35 can protrude outwardly (inside the test chamber 102) on the lower side of casing 81 via the hole provided in the lower wall of casing 81 (FIG. 6).

On the other hand, in addition to the inner chamber 104, IC devices 2 carried on the test tray TST, socket 40, and the upper portion of test head 5 are contained inside the casting 80 constituting the test chamber 102. An air blowing unit for temperature adjustment 90 and a temperature sensor 82 are also provided therein.

The air blowing units for temperature adjustment 90, 91 comprise the respective fans 92, 96 and heat-exchange units 94, 98. Air present inside the casings is sucked in by fans 92, 96 and circulated by discharging into casings 80, 81 via the heat-exchange units 94, 98, thereby providing for the prescribed temperature conditions (high temperature or low temperature) inside the casings 80, 81.

The heat-exchange units 94, 98 of air blowing units for temperature adjustment 90, 91 can be composed of a thermoelectric heater or a radiation heat exchanger with a heating medium flowing therethrough, when the inside of the casings is to be at a high temperature, and can supply the quantity of heat sufficient to maintain the inside of the casings at a high temperature, for example, from room temperature to about 160° C. Furthermore, when the inside of the casings is to be at a low temperature, the heat-exchange units 94, 98 can be composed of absorption heat exchangers having a cooling medium such as liquid nitrogen or the like circulating therein and can absorb the quantity of heat sufficient to maintain the inside of the casings at a low temperature, for example, from about −60° C. to room temperature. The temperature inside the casings 80, 81 is detected, for example, with temperature sensors 82, 83 and the blowing rate of fans 92, 96 and the quantity of heat in heat-exchange units 94, 98 are controlled so as to maintain the inside of casings 80, 81 at the prescribed temperature.

Warm or cold blast generated via the heat exchanger 98 of air blowing unit for temperature adjustment 91 inside the casing 81 constituting the inner chamber 104 circulates inside the casing by flowing along the Y axis direction above the casing 81, coming down along the casing side wall on the opposite side from the air blowing unit for temperature adjustment 91, passing through the gap between the lower wall of casing 81 and match plate 60, and returning to the air blowing unit for temperature adjustment 91. With such a configuration, warm or cold blast is sequentially supplied in series to heat sinks 35 positioned between the lower wall of casing 81 and match plate 60.

On the other hand, warm or cold blast generated via the heat exchanger 94 of air blowing unit for temperature adjustment 90 inside the casing 80 constituting the test chamber 102 circulates inside the casing by flowing along the Y axis direction above the casing 80, coming down along the casing side wall on the opposite side from the unit 90, passing through-the gap between the test head 5 and bottom surface of casing 81 constituting the inner chamber 104, and returning to the unit 90. With such a configuration, warm or cold blast is sequentially supplied in series to sockets 40 positioned between the test head 5 and bottom surface of casing 81.

Fourthly, parts relating to the unloader section 400 will be described.

X-Y transportation units 404, 404 identical in structure of X-Y transportation unit 304 provided in the loader section 300 are also provided in the unloader section 400 shown in FIG. 2 and FIG. 3. The X-Y transportation units 404, 404 are used to retransfer the tested IC devices from the test tray TST carried out to the unloader section 400 to the customer tray KST.

As shown in FIG. 2, two pairs of windows 406, 406 disposed so as to face the customer tray KST carried to the unloader section 400 on the upper surface of apparatus substrate 105 are provided in an open condition in the apparatus substrate 105 of unloader section 400.

Elevators 204 for lifting the customer tray KST are provided (see FIG. 4) below each window 406. Here, the loaded customer tray KST to which the tested IC devices are retransferred is carried, lowered, and transferred to the tray transfer arm 205.

A method for testing IC devices 2 while conducting temperature control of IC devices 2 in the IC device test apparatus 10 explained above will be described below.

In a state in which IC devices 2 are loaded on a test tray TST shown in FIG. 7, more specifically, in a state in which each of IC devices 2 is dropped in the IC housing parts 19 of insert 16 shown in the same figure, the devices are transported into test chamber 102 after heating to the prescribed set temperature in the thermostatic chamber 101.

When the test tray TST carrying the IC devices 2 is stopped above the test head 5, the Z axis drive unit is activated and the pressing member 74 secured to the drive plate 72 pushes the pusher base 33 via the rod 621 of adapter 62. As a consequence, the pushing member 31 of pusher 30 pushes the package body of IC device 2 against the socket 40 side. As a result, the connection terminals of IC device 2 are connected to the probe pins 44 of socket 40.

Further, the downward movement of pusher 30 is controlled by the stopper pins 34 of pusher 30 abutting upon the stopper surface 412 of socket guide 41. Therefore, the pusher 30 can push the IC device 2 against the socket 40 by an appropriate pressure, without fracturing the IC device 2.

In such a state, a test electric signal is transmitted from the main testing unit 6 to the IC device 2 to be tested, via the probe pins 44 of test head 5 and the test is conducted. The temperature of pusher 30 in a stand-by mode is controlled to the prescribed set temperature with warm or cold blast (air) inside the inner chamber 104, and the temperature inside the test chamber 102 produces practically no effect. Therefore, the conventional problem of the temperature of pusher 30 located in a stand-by mode close to the center of test chamber 102 rising above the set temperature is resolved and the temperature of IC device 2 which is pressed against the pusher 30 can be prevented from rising in excess above the set temperature.

Further, when the IC device 2 to be tested, is heated by self-generation of heat, heat of the IC device 2 to be tested is transmitted from the pushing member 31 of pusher 30 to the heat sink 35 via the pusher base 33 and radiated from the heat sink 35. Because the heat sink 35 can be cooled by controlling the temperature, volume of air and the like inside the inner chamber 104, excess increase in temperature of the IC device 2 to be tested can be prevented even when the IC device 2 is heated by self-generation of heat.

At this time, the temperature close to the socket 40 through which heat can easily escape from inside the test chamber 102 can be maintained at the prescribed set temperature, without being effected by the temperature inside the inner chamber 104, by controlling the temperature and volume of air inside the test chamber 102. Therefore, excess temperature decrease of socket 40 and, therefore, IC device 2 can be prevented.

Thus, providing a chamber 104 for heat sink inside the test chamber 102 and conducting separate temperature control of the chambers make it possible to conduct accurate testing of IC devices 2, while controlling the temperature thereof close to the set temperature.

[Second Embodiment]

Figure 10:
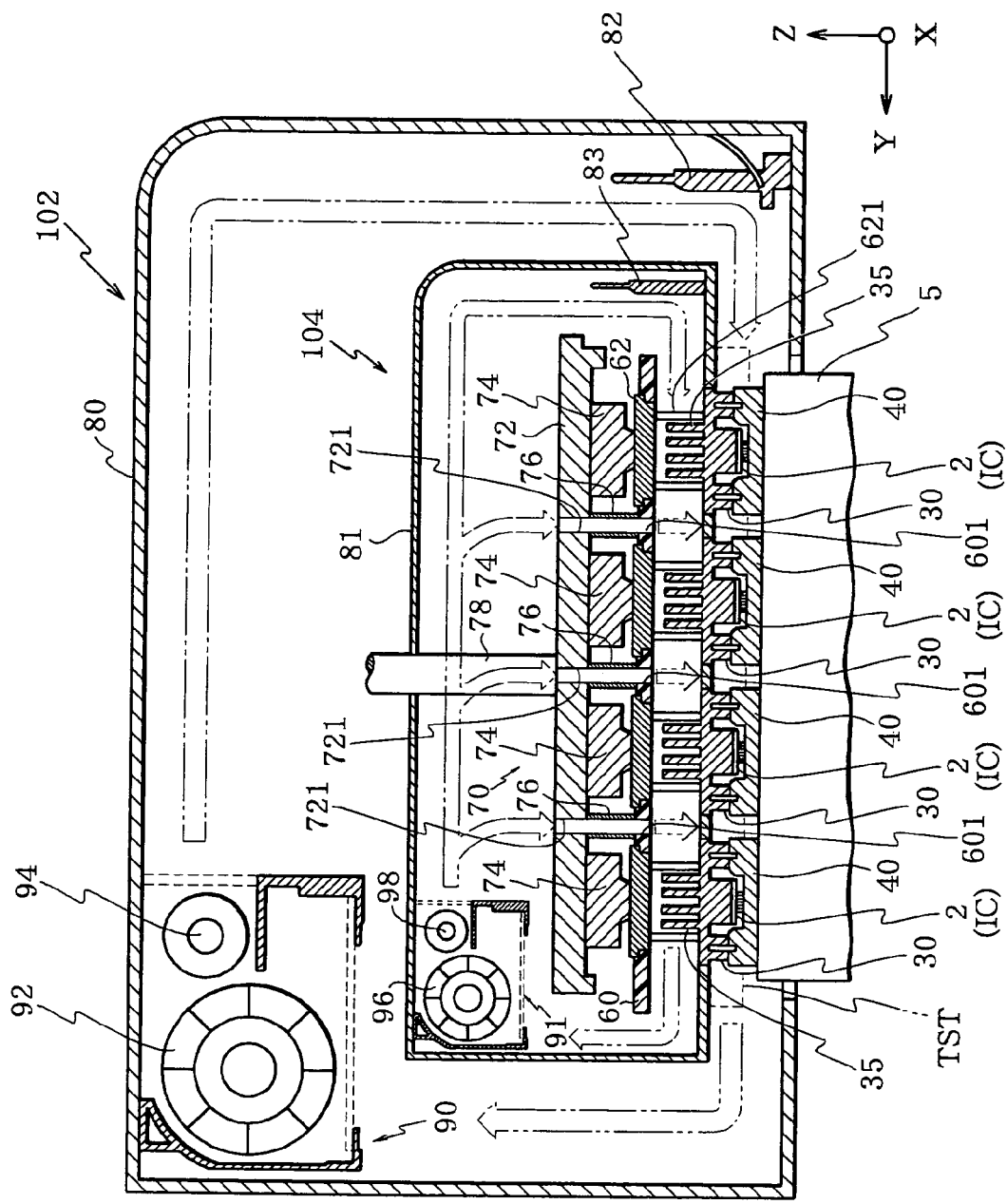
FIG. 10 is a cross-sectional view of the main part inside a test chamber of the handler of the second embodiment of the present invention.

The second embodiment of the present invention will be described below. The handler of the second embodiment has a structure almost identical to that of the handler 1 of the first embodiment. However, as shown in FIG. 10, it differs from the handler 1 of the first embodiment in that through holes 721 are formed in the drive plate 72 contained inside the chamber 104 for heat sink, through holes 601 are formed in the match plate 60, and pipe members 76 are provided for linking the through holes 721 of drive plate 72 with the through holes 601 of match plate 60.

Warm or cold blast (air) generated via the heat exchanger 98 of air blowing unit for temperature adjustment 91 inside the inner chamber 104 of such a handler circulates inside the casing by flowing along the Y axis direction above the casing 81, coming down via through holes 721 of drive plate 72, pipe members 76, and through holes 601 of match plate 60 (partly along the side wall of the casing on the side opposite the air blowing unit for temperature adjustment 91), passing through the gap between the lower wall of casing 81 and match plate 60, and returning to the air blowing unit for temperature adjustment 91. With such a configuration, air is supplied in parallel to heat sinks 35 positioned between the lower wall of casing 81 and match plate 60.

As shown in FIG. 6, when air is supplied in series to the heat sinks 35, each time the air passes through the heat sinks 35, the temperature increases due to heat radiation from the heat sinks 35. Therefore, the heat sinks 35 through which the air passes at the end are sometimes difficult to cool. Such temperature gradient in the air especially easily occurs when a large number of IC devices 2 are tested at the same time.

Accordingly, if the air is supplied in parallel to the heat sinks 35, as in the present embodiment, the air is uniformly blown onto each heat sink 35 and insufficient cooling of heat sinks 35 caused by temperature gradient in air can be prevented.

[Third Embodiment]

Figure 11:
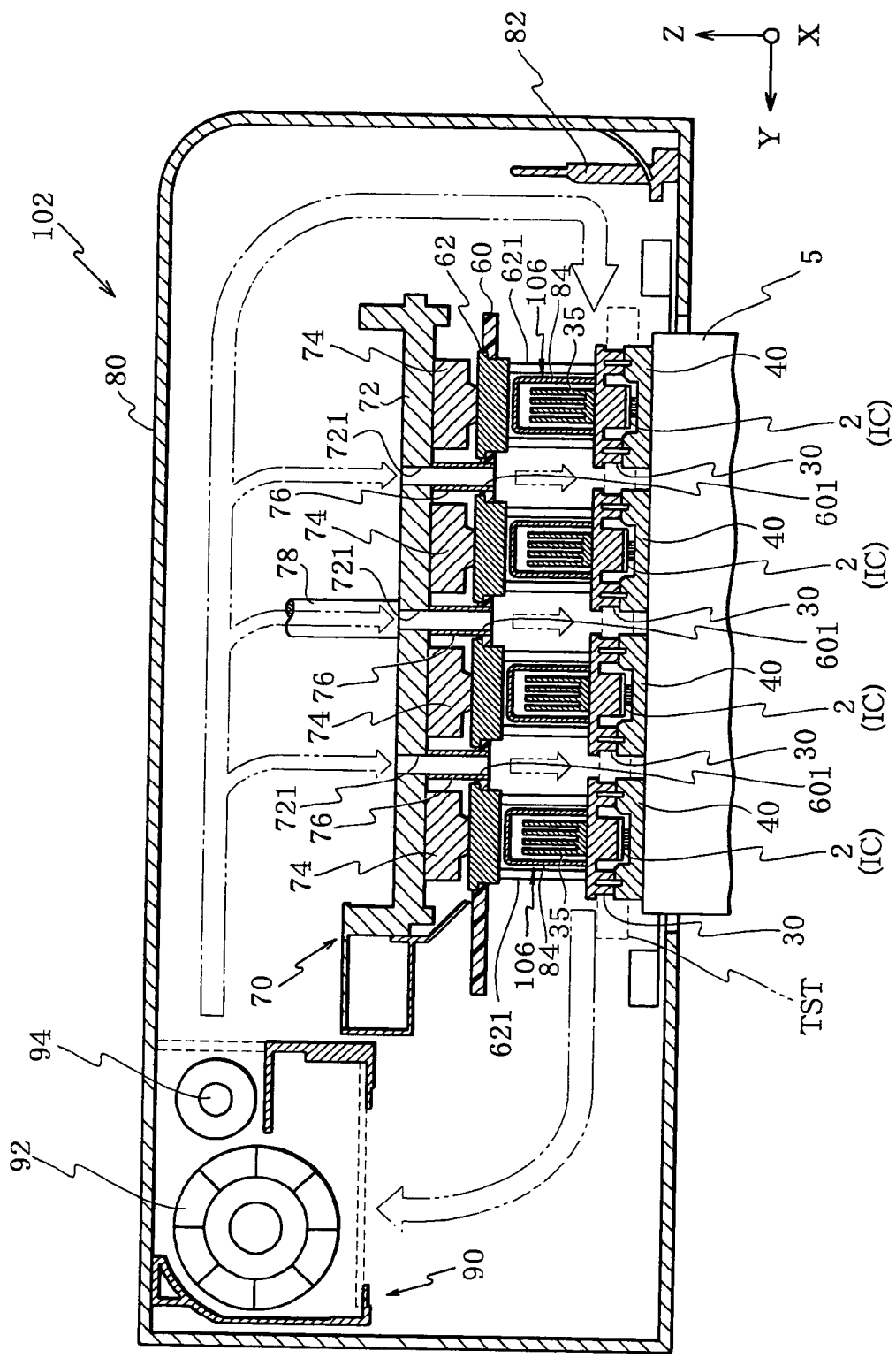
FIG. 11 is a cross-sectional view of the main part inside a test chamber of the handler of the third embodiment of the present invention.

The third embodiment of the present invention will be described below. The handler of the third embodiment has a structure similar to that of the handler of the second embodiment, but it comprises no casing 81 (inner chamber 104) containing inside thereof the drive shaft 78, drive plate 72, pressing member 74, match plate 60, and adaptor 62. Instead, as shown in FIG. 11, the handler comprises heat sink chambers 106 in which only the heat sinks 35 of a plurality of pushers 30 belonging to the same row are sealed with ducts 84.

A temperature adjusting medium such as warm blast or cool air from an air blowing unit for temperature adjustment (not shown in the figure), or warm water or cool water from a water pump for temperature adjustment flows inside the ducts 84 constituting the heat sink chambers 106, and the temperature control of heat sinks 35 in each row is conducted by this temperature adjusting medium.

Warm or cold blast (air) generated via the heat exchanger unit 92 of air blowing unit for temperature adjustment 90 inside the test chamber 102 of the handler comprising such heat sink chamber 106 circulates inside the casing by flowing along the Y axis direction above the casing 80, coming down via through holes 721 of drive plate 72, pipe members 76, and through holes 601 of match plate 60 (partly along the side wall of the casing on the side opposite the air blowing unit for temperature adjustment 90), passing through the gap between the match plate 60 and test head 5, and returning to the air blowing unit for temperature adjustment 90. With such a configuration, air is supplied in parallel to sockets 40 positioned between the match plate 60 and test head 5.

As shown in FIG. 6, when air is supplied in series to the sockets 40, each time the air passes through the sockets 40, air is affected by the temperature of sockets 40, and the temperature of sockets 40 through which the air passes at the end is sometimes difficult to control. Such temperature gradient in the air especially easily occurs when a large number of IC devices 2 are tested at the same time.

Accordingly, if the air is supplied in parallel to the sockets 40, as in the present embodiment, the air is uniformly blown onto each sockets 40 and the adverse effect of temperature gradient in air on temperature control of sockets 40 can be prevented.

[Fourth Embodiment]

The fourth embodiment of the present invention will be described below. The handler of the fourth embodiment has a structure similar to that of the handler of the first embodiment. However, as shown in FIG. 12, the space where the heat sinks 35 of pushers 30 are positioned, that is, the space between the pusher base 33 of pushers 30, and the match plate 60 and adapter 62 (this space will be referred to hereinbelow as the "space above the pushers") is partitioned with a horizontal partition plate 36 into a lower-layer portion 362 and an upper-layer portion 364.

Furthermore, in the air blowing unit for temperature adjustment 91 which is equipped with the fan 96 and heat-exchange unit 98, there are provided a duct 971 leading from the body 97 of air blowing unit for temperature adjustment 91 to an opening on one side (right-side opening in FIG. 12) in the lower-layer portion 362 of the space above the pushers, a duct 972 leading to an opening on one side (left-side opening in FIG. 12) in the upper-layer portion 364 of the space above the pushers, a duct 973 leading to an opening on the other side (left-side opening in FIG. 12) in the lower-layer portion 362 of the space above the pushers, and a duct 974 leading to an opening on the other side (right-side opening in FIG. 12) in the upper-layer portion 364 of the space above the pushers.

Figure 12:
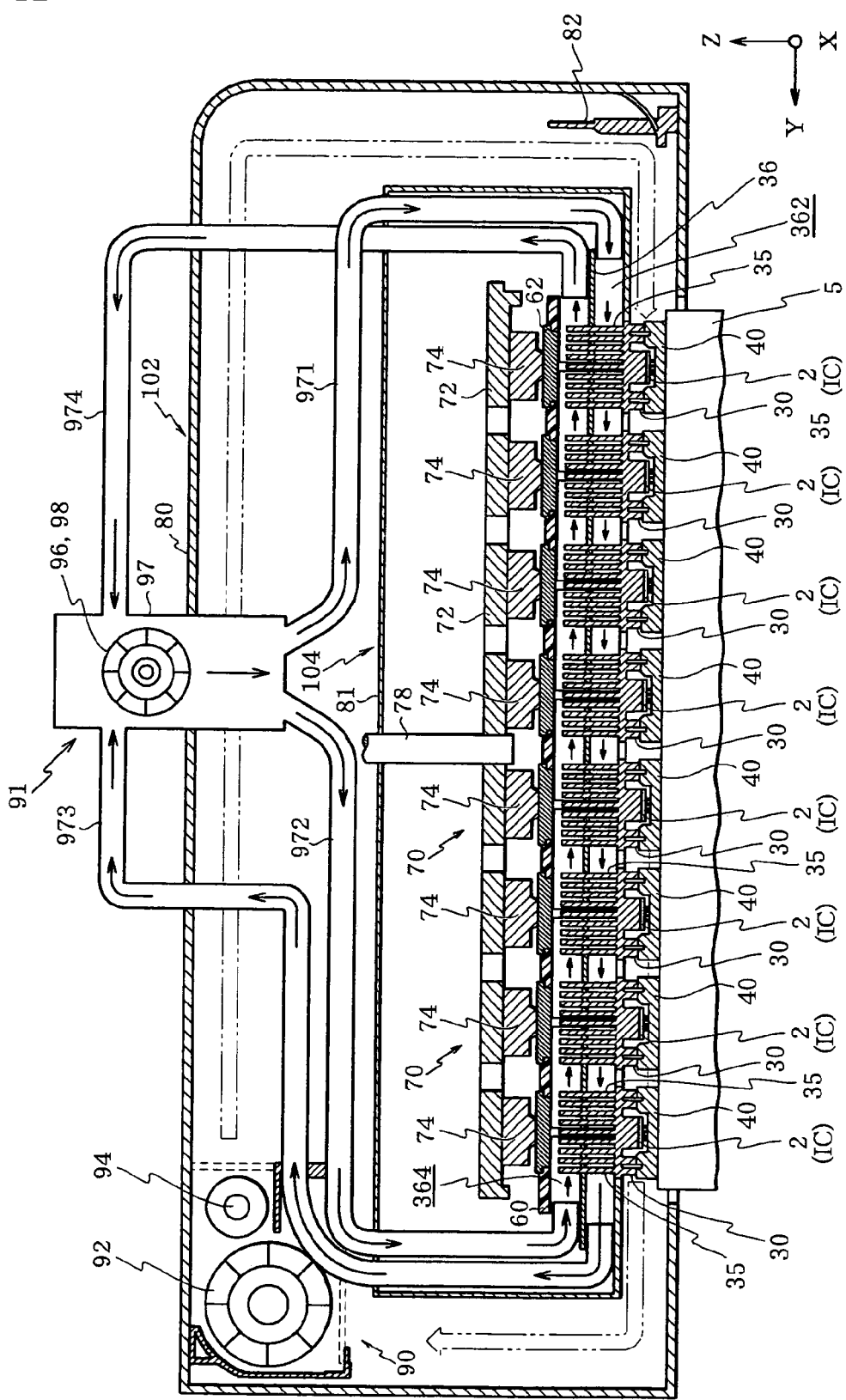
FIG. 12 is a cross-sectional view of the main part inside a test chamber of the handler of the fourth embodiment of the present invention.

Further, as shown in FIG. 12, parts of the body 97 of air blowing unit for temperature adjustment 91 and ducts 971, 972, 973, and 974 are provided outside the test chamber 102, but this configuration is not limiting and they may be provided inside the test chamber 102 or inside the inner chamber 104.

In such a handler, warm or cold blast (air) generated via the heat-exchange unit 98 of air blowing unit for temperature adjustment 91 is introduced from the body 97 of air blowing unit for temperature adjustment 91 into the right-side opening of the lower-layer portion 362 of the space above the pushers via the duct 971 and into the left-side opening of the upper-layer portion 364 of the space above the pushers via the duct 972.

Air introduced into the right-side opening of the lower-layer portion 362 of the space above the pushers is supplied in series below the heat sinks 35 of pushers 30 and then returns to the body 97 of air blowing unit for temperature adjustment 91 via the duct 973. Furthermore, air introduced into the left-side opening of the upper-layer portion 364 of the space above the pushers is supplied in series above the heat sinks 35 of pushers 30 and then returns to the body 97 of air blowing unit for temperature adjustment 91 via the duct 974. The air is thus caused to circulate while being supplied so as to flow in mutually different directions on the lower-layer portion 362 (below heat sinks 35) and upper-layer portion 364 (above heat sinks 35) of the space above the pushers.

When air is supplied in series to the heat sinks 35, the air temperature rises due to heat radiation from the heat sinks 35 each time the air passes through the heat sink 35. For this reason, the heat sinks 35 through which the air passes at the end are sometimes difficult to cool. However, in the present embodiment, air is blown from different directions above and below the heat sinks 35. For example, in the heat sinks 35 shown on the right end in FIG. 12, low-temperature air is blown below and air with increased temperature is blown above the heat sinks 35, in the heat sinks 35 shown on the left end in FIG. 12, low-temperature air is blown above and air with increased temperature is blown below the heat sinks 35, and in the heat sinks 35 shown in the center in FIG. 12, medium-temperature air (air with half raised temperature) is blown both below and above the heat sinks 35. As a result of totaling the temperature below and above the heat sinks 35, each heat sink 35 can be controlled to an almost constant temperature and insufficient cooling of heat sinks caused by temperature gradient in air is prevented.

[Fifth Embodiment]

Figure 13:
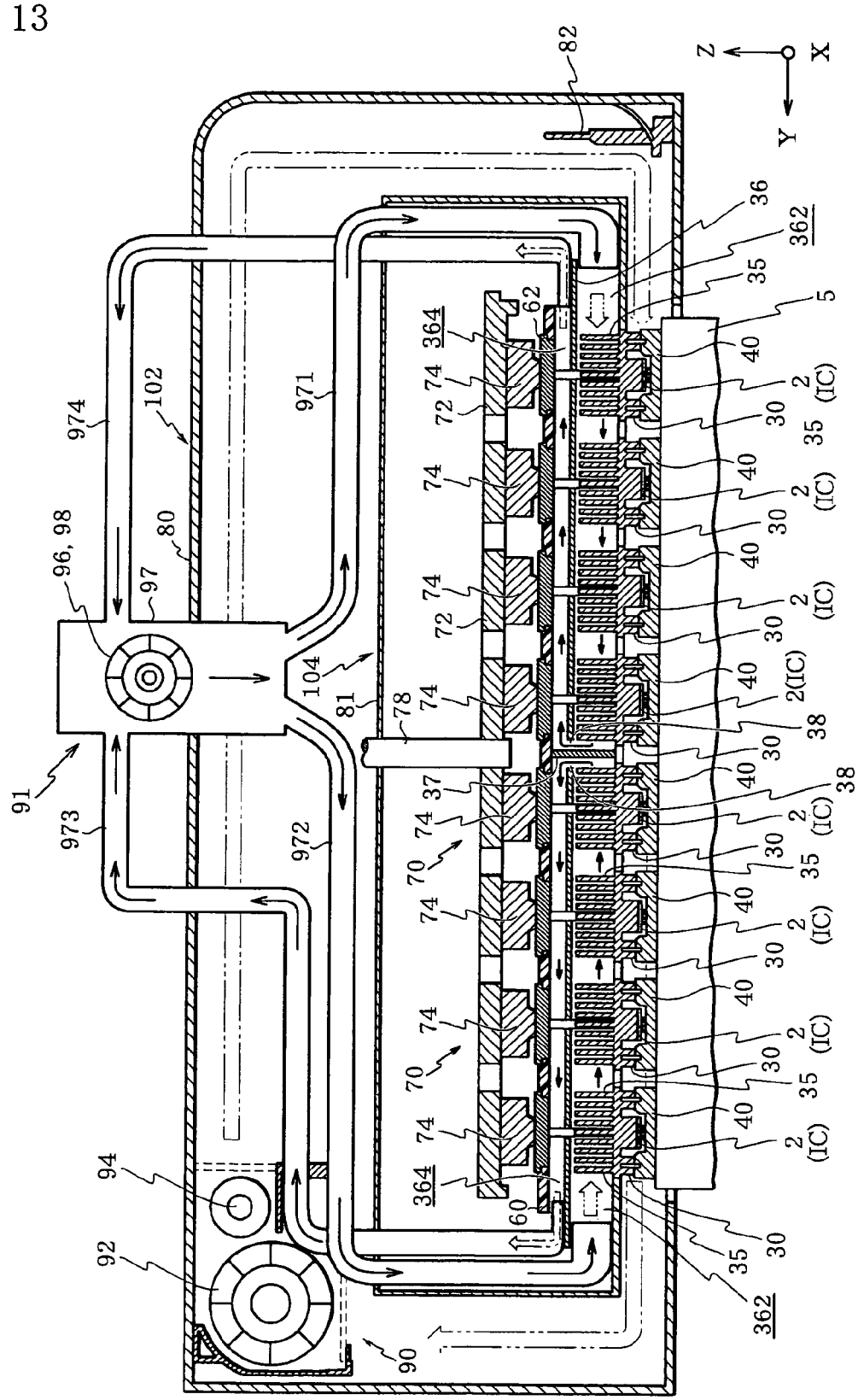
FIG. 13 is a cross-sectional view of the main part inside a test chamber of the handler of the fifth embodiment of the present invention.

Fifth embodiment of the present invention will be described below. The handler of the fifth embodiment has a structure similar to that of the handler of the above-described fourth embodiment. However, as shown in FIG. 13, the space (space above the pushers) between the pusher base 33 of pushers 30, and the match plate 60 and adapter 62 is partitioned into the left and right sections with a vertical partition plate 37 provided in the vertical direction. As a result, the heat sings 35 of a plurality of pushers 30 are divided into left and right groups.

Further, the spaces above the pushers that have been partitioned by the vertical partition plate 37 are further partitioned into a lower-layer portion 362 where the heat sinks 35 of pushers 30 are located and an upper-layer portion 364 between the heat sinks 35, match plate 60, and adapter 62 by a horizontal partition plate 36 provided in the horizontal direction. However, because the horizontal partition plate 36 is provided so as not to be in contact with the vertical partition plate 37, a gap between the vertical partition plate 37 and horizontal partition plate 36 becomes a connecting portion 38 linking the lower-layer portion 362 and upper-layer portion 364 in the space above the pushers.

In the air blowing unit for temperature adjustment 91 which is equipped with the fan 96 and heat-exchange unit 98, there are provided a duct 971 leading from the body 97 of air blowing unit for temperature adjustment 91 to an opening on one side (right-side opening in FIG. 13) in the lower-layer portion 362 of the space above the pushers, a duct 972 leading to an opening on the other side (left-side opening in FIG. 13) in the lower-layer portion 362 of the space above the pushers, a duct 973 leading to an opening on one side (left-side opening in FIG. 13) in the upper-layer portion 364 of the space above the pushers, and a duct 974 leading to an opening on the other side (right-side opening in FIG. 13) in the upper-layer portion 364 of the space above the pushers.

Furthermore, as shown in FIG. 13, parts of the body 97 of air blowing unit for temperature adjustment 91 and ducts 971, 972, 973, and 974 are provided outside the test chamber 102, but this configuration is not limiting and they may be provided inside the test chamber 102 or inside the inner chamber 104.

In such a handler, warm or cold blast (air) generated via the heat-exchange unit 98 of air blowing unit for temperature adjustment 91 is introduced from the body 97 of air blowing unit for temperature adjustment 91 into the right-side opening of the lower-layer portion 362 of the space above the pushers via the duct 971 and into the left-side opening of the lower-layer portion 362 of the space above the pushers via the duct 972.

Air introduced into the right-side opening of the lower-layer portion 362 of the space above the pushers is supplied in series to the heat sinks 35 of pushers 30 on the right side, then passes through the upper-layer portion 364 via the connecting portion 38, and returns to the body 97 of air blowing unit for temperature adjustment 91 via the duct 974. Furthermore, air introduced into the left-side opening of the lower-layer portion 362 of the space above the pushers is supplied in series to the heat sinks 35 of pushers 30 on the left side, then passes through the upper-layer portion 364 via the connecting portion 38, and returns to the body 97 of air blowing unit for temperature adjustment 91 via the duct 973. The air is thus caused to circulate while being supplied via different routs to the left-side group and right-side group of heat sinks 35 of pushers 30.

When air is supplied in series to multiple heat sinks 35, the air temperature rises due to heat radiation from the heat sinks 35 each time the air passes through the heat sinks 35. For this reason, the heat sinks 35 through which the air passes at the end are sometimes difficult to cool. However, in the present embodiment, the heat sinks 35 are divided into two groups and air is supplied to each group of heat sinks 35 via different routes. Therefore, the number of heat sinks 35 through which the air passes is decreased and increase in air temperature is suppressed. Thus, in the present embodiment, insufficient cooling of heat sinks 35 caused by the increase in air temperature can be suppressed.

[Sixth Embodiment]

Figure 14:
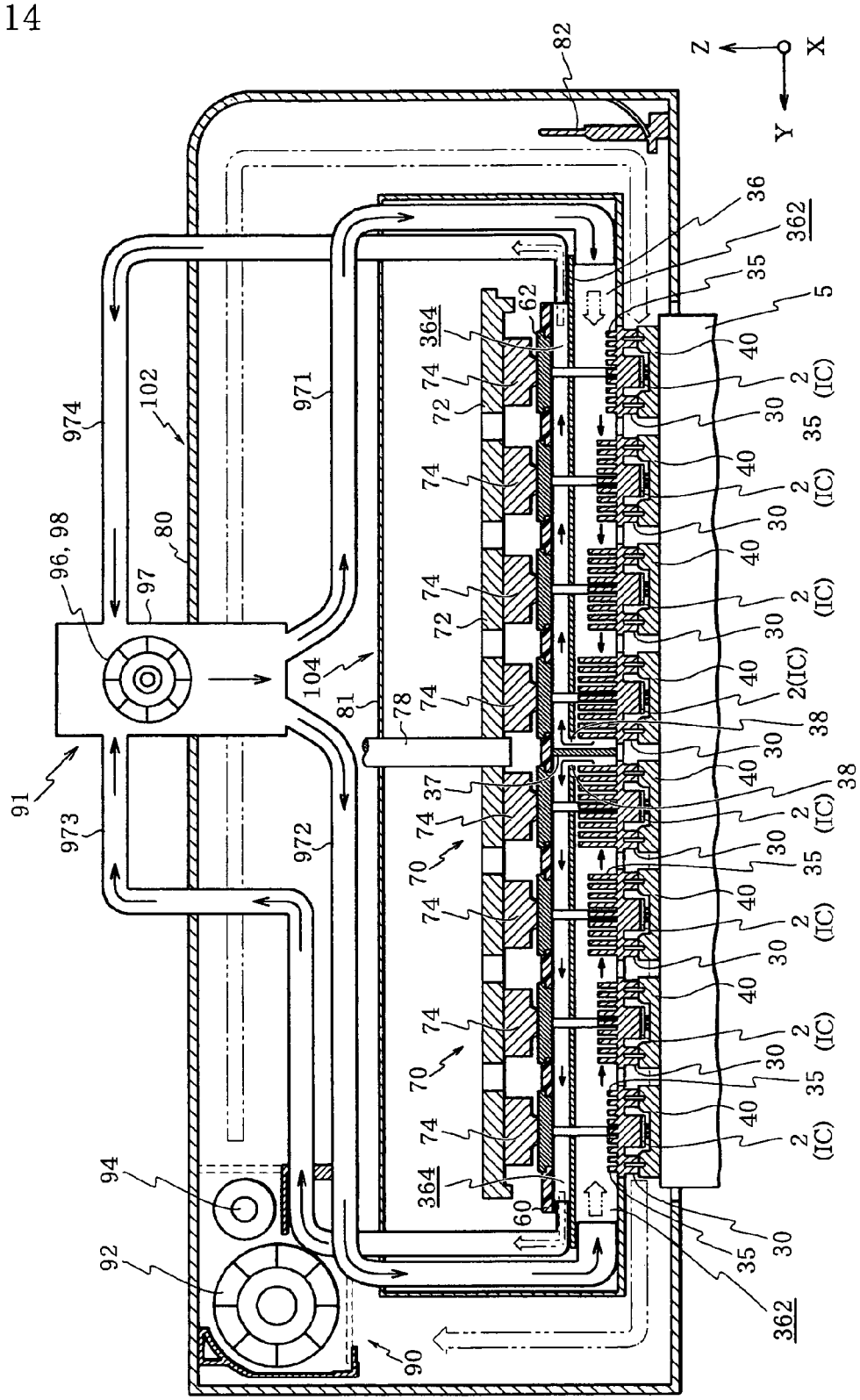
FIG. 14 is a cross-sectional view of the main part inside a test chamber of the handler of the sixth embodiment of the present invention.

Sixth embodiment of the present invention will be described below. The handler of the sixth embodiment has a structure similar to that of the handler of the above-described fifth embodiment. As shown in FIG. 14, the heat sinks 35 of pushers 30 are provided so that the heat absorption and radiation capacity gradually increases in the flow direction of air. Thus, in the heat sinks 35 of the right group, the height of radiation fins gradually increases from the right to the left, and in the heat sinks 35 of the left group, the height of radiation fins gradually increases from the left to the right.

In such a handler, the pushers 30 relating to heat sinks 35 (heat sinks 35 on the right end and left end in FIG. 14) onto which the air is initially blown can be cooled because the air temperature is low despite a low heat absorption and radiation capacity of heat sinks 35, and the pushers 30 relating to the heat sinks 35 (heat sinks 35 in the central portion in FIG. 14) onto which the air is blown at the end can be cooled despite the increase in air temperature, because the heat absorption and radiation capacity of heat sinks 35 is high. With the present embodiment, all the pushers 30 can be thus controlled to an almost constant temperature.

[Other Embodiments]

The above-described embodiments are described for the purpose of facilitating the understanding of the present invention and are not intended to limit the present invention. Therefore, elements disclosed in the embodiments also include all the design modifications and equivalents within the technological scope of the present invention.

For example, the arrangement orientation of radiation fins of heat sinks 35 may be changed through 90° from the state described in the embodiments, so as to facilitate the volume of air circulated inside the inner chamber 104, and a configuration comprising the radiation fins stacked in the vertical direction may be also used. Furthermore, the duct 84 in the third embodiment may have a configuration sealing heat sinks 35 of a plurality of pushers 30 belonging to the same row. Moreover, the height of radiation fins in the heat sinks 35 of pushers 30 in the first embodiment may gradually increase along the flow direction of air, as in the heat sinks 35 of pushers 30 in the sixth embodiment.

INDUSTRIAL APPLICABILITY

As described above, with the present invention, temperature control can be conducted so as to bring the temperature of electronic components close to the set temperature of the target test. Thus, the apparatus for handling electronic components and method for controlling the temperature of electronic devices in accordance with the present invention are effective for conducting tests requiring accurate temperature control of electronic components.

What is claimed is:

1. An apparatus for handling electronic components, in which terminals of the electronic components to be tested can be pushed into contact portions of a test head with the pushers provided with heat absorbing and radiating bodies in order to conduct testing of the electronic components, comprising:
    a unit for controlling the temperature of a first atmosphere where the contact portions of said test head are located; and
    a unit for controlling the temperature of a second atmosphere where the heat absorbing and radiating bodies of said pushers are located,
    wherein the first atmosphere and the second atmosphere are substantially separate.

2. An apparatus for handling electronic components, in which terminals of the electronic components to be tested can be pushed into contact portions of a test head with the pushers provided with heat absorbing and radiating bodies in order to conduct testing of the electronic components, comprising:
    a first chamber containing inside thereof the heat absorbing and radiating bodies of said pushers;
    a unit for controlling the atmosphere temperature inside said first chamber;
    a second chamber containing inside thereof the contact portions of said test head and said first chamber; and
    a unit for controlling the atmosphere temperature inside said second chamber.

3. The apparatus for handling electronic components according to claim 2, wherein:
    a plurality of pushers and a plurality of contact portions of the test head are provided to enable testing of a plurality of electronic components to be tested at one time;
    the heat absorbing and radiating bodies of said pushers are provided for each said pusher;
    the temperature of atmosphere inside said first chamber is controlled with a temperature-adjusting medium; and
    the temperature-adjusting medium inside said first chamber is supplied in parallel to the heat absorbing and radiating bodies of said pushers.

4. The apparatus for handling electronic components according to claim 3, wherein:
    said pushers push terminals of electronic components to be tested into contact portions of a test head by being pressed with a pressing member supported with a support member;
    a plurality of through holes are formed in said support member; and
    the temperature-adjusting medium inside said first chamber is supplied in parallel to the heat absorbing and radiating bodies of said pushers by passing through the through holes formed in said support member.

5. The apparatus for handling electronic components according to claim 2, wherein:
    a plurality of pushers and a plurality of contact portions of said test head are provided to enable testing of a plurality of electronic components to be tested at one time;
    the heat absorbing and radiating bodies of said pushers are provided for each said pusher;
    the temperature of atmosphere inside said first chamber is controlled with a temperature-adjusting medium; and
    the temperature-adjusting medium inside said first chamber is supplied in series to the heat absorbing and radiating bodies of said pushers.

6. The apparatus for handling electronic components according to any of claims 3 through 5, wherein:
    the temperature of atmosphere inside said second chamber is controlled with a temperature-adjusting medium; and
    the temperature-adjusting medium inside said second chamber is supplied in parallel to the contact portions of said test head.

7. The apparatus for handling electronic components according to claim 6, wherein:
    a plurality of said first chambers are provided independently; and
    the temperature-adjusting medium inside said second chamber is supplied in parallel to the contact portions of said test head by passing between those first chambers.

8. The apparatus for handling electronic components according to claim 5, wherein:
    the space where the heat absorbing and radiating bodies of said pushers are positioned in said first chamber is partitioned into an upper-layer portion and a lower-layer portion and said temperature-adjusting medium is supplied so as to flow in the mutually opposite directions in the upper-layer portion and lower-layer portion.

9. The apparatus for handling electronic components according to claim 5, wherein the heat absorbing and radiating bodies of said plurality of pushers in said first chamber are divided in no less than two groups and each space where said each group is located comprises a lower-level portion where the heat absorbing and radiating bodies of said pushers are positioned and into which the temperature-adjusting medium is supplied, an upper-layer portion into which the temperature-adjusting medium that has passed through the heat absorbing and radiating bodies is released, and a connection portion for connecting said lower-level portion and said upper-layer portion.

10. The apparatus for handling electronic components according to claim 5, wherein the heat absorption and radiation capacity of the heat absorbing and radiating bodies of said plurality of pushers gradually increases along the flow direction of said temperature-adjusting medium.

11. A method for controlling the temperature of electronic components to be tested in an apparatus for handling electronic components, in which terminals of the electronic components to be tested can be pushed into contact portions of a test head with pushers provided with heat absorbing and radiating bodies in order to conduct testing of the electronic components, comprising:

substantially separating a first atmosphere where the contact portions of said test head are located and a second atmosphere where the heat absorbing and radiating bodies of said pushers are located; and separately controlling the temperature of the first atmosphere where the contact portions of said test head are located and the temperature of the second atmosphere where the heat absorbing and radiating bodies of said pushers are located.

12. The apparatus for handling electronic components according to claim 1, further comprising a first chamber containing inside thereof the first atmosphere; and a second chamber containing inside thereof the second atmosphere.

13. The apparatus for handling electronic components according to claim 12, wherein:

the space where the heat absorbing and radiating bodies of said pushers are located in said second chamber is partitioned into an upper-layer portion and a lower-layer portion and said unit for controlling the temperature of the atmosphere therein supplied causes a temperature controlling medium therein to flow in the mutually opposite directions in the upper-layer portion and lower-layer portion.

14. The method of claim 11, wherein the first atmosphere and the second atmosphere are separated by being disposed within a first chamber containing inside thereof the first atmosphere and a second chamber containing inside thereof the second atmosphere.

* * * * *